(12) United States Patent
Cheng et al.

(10) Patent No.: US 10,153,367 B2
(45) Date of Patent: Dec. 11, 2018

(54) GATE LENGTH CONTROLLED VERTICAL FETS

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 108 days.

(21) Appl. No.: 15/206,939

(22) Filed: Jul. 11, 2016

(65) Prior Publication Data

US 2018/0012993 A1    Jan. 11, 2018

(51) Int. Cl.
| | |
|---|---|
| *H01L 29/78* | (2006.01) |
| *H01L 29/66* | (2006.01) |
| *H01L 21/3105* | (2006.01) |
| *H01L 21/02* | (2006.01) |
| *H01L 29/08* | (2006.01) |
| *H01L 21/033* | (2006.01) |
| *H01L 21/8234* | (2006.01) |
| *H01L 29/10* | (2006.01) |

(52) U.S. Cl.
CPC .... *H01L 29/7827* (2013.01); *H01L 21/02636* (2013.01); *H01L 21/0332* (2013.01); *H01L 21/31055* (2013.01); *H01L 21/823487* (2013.01); *H01L 29/0847* (2013.01); *H01L 29/1037* (2013.01); *H01L 29/66666* (2013.01)

(58) Field of Classification Search
CPC combination set(s) only.
See application file for complete search history.

(56) References Cited

U.S. PATENT DOCUMENTS

| | | | |
|---|---|---|---|
| 6,638,823 B2 | 10/2003 | Cho et al. | |
| 6,787,402 B1 | 9/2004 | Yu | |
| 6,846,709 B1 | 1/2005 | Lojek | |
| 7,446,025 B2 | 11/2008 | Cohen et al. | |
| 7,456,476 B2 | 11/2008 | Hareland et al. | |
| 9,287,362 B1 | 3/2016 | Basu et al. | |
| 2010/0181614 A1 | 7/2010 | Nojima | |
| 2011/0303985 A1* | 12/2011 | Masuoka | H01L 21/84 257/369 |
| 2015/0061013 A1* | 3/2015 | Basu | H01L 29/785 257/347 |

OTHER PUBLICATIONS

B. A. Anderson et al., "Vertical Transistor Fabrication and Devices," U.S. Appl. No. 14/975,168, filed Dec. 18, 2015. (2015a).

(Continued)

*Primary Examiner* — Ratisha Mehta
(74) *Attorney, Agent, or Firm* — Vazken Alexanian; McGinn IP Law Group, PLLC

(57) ABSTRACT

A semiconductor structure and a method a method of forming a vertical FET (Field-Effect Transistor), includes growing a bottom source-drain layer of a second type on a substrate of a first type, growing a channel layer on the bottom source-drain layer, forming a first fin from the channel layer with mask on top of the first fin. A width of the mask is wider than a final first fin width.

20 Claims, 9 Drawing Sheets

(56) References Cited

OTHER PUBLICATIONS

B. A. Anderson et al., "Variable Gate Lengths for Vertical Transistors," U.S. Appl. No. 14/970,624, filed Dec. 16, 2015. (2015b).
K. Cheng et al., "Fabrication of Vertical Field Effect Transistor Structure With Controlled Gate Length," U.S. Appl. No. 15/087,074, filed Mar. 31, 2016.
J. M. Hergenrother et al., "The vertical replacement-gate (VRG) MOSFET: A 50-nm vertical MOSFET with lithography-independent gate length," International Electron Devices Meeting, 1999, pp. 75-78.

* cited by examiner

GATE LENGTH CONTROLLED VERTICAL FETS

BACKGROUND OF THE INVENTION

Field of the Invention

The present invention relates generally to a method and apparatus for Vertical FETs (Field-Effect Transistors), and more particularly, but not by way of limitation, relating to a method and apparatus for gate length controlled vertical FETs.

Description of the Related Art

VFETs (Vertical Field-Effect Transistor) are a promising architecture for beyond 7 nm CMOS (Complementary metal-oxide-semiconductor) technology, but the manufacture of such devices has made limited improvements. Some integration techniques require the finned channel region to be formed by growth inside a confined cavity. Such VFET integration schemes assume that the fin region is formed inside such a cavity, which is defined/etched through the material that eventually becomes the bottom source/drain spacer. This type of process flow poses a defectivity risk for the finned epitaxy, at the interface between the finned epitaxy region and the bottom source/drain region upon which this epitaxy is grown. The grown fin has such problems and others.

Such techniques also require additional gate etching (which would compromise gate resistance), but this approach poses a risk for defective epitaxial growth for the finned channel regions. Additionally, this type of approach requires added complexity in order to form thick gate dielectric and thin gate dielectric devices on the same chip. Therefore, there is need for providing long and short channel devices in vertical channel transistor device chips that is easy to manufacture.

In addition, gate length control is very important but difficult in vertical FETs and so there is a need to have a technique that can efficiently control a gate length in vertical FETs.

There is also a need to provide a more efficient technique of forming an FET including a VFET and other devices that have reduced defects and reduce the complexity of manufacture.

SUMMARY OF INVENTION

In view of the foregoing and other problems, disadvantages, and drawbacks of the aforementioned background art, an exemplary aspect of the present invention provides a system, apparatus, and method of providing gate length controlled vertical FETs.

One example aspect of the present invention provides a method of forming a vertical FET (Field-Effect Transistor), including growing a bottom source-drain layer of a second type on a substrate of a first type, growing a channel layer on the bottom source-drain layer, forming a first fin from the channel layer with mask on top of the first fin, wherein a width of the mask is wider than a final first fin width.

The method further includes trimming the first fin laterally to a predetermined width, and forming a bottom spacer on the bottom source-drain layer.

The method can also include forming a high-k dielectric layer on the bottom spacer, first fin, and the mask, forming and metal gate layer on the high-k dielectric layer, recessing the metal gate layer, and removing an exposed portion of the high-k dielectric layer, filling an interlayer dielectric over the bottom spacer, performing chemical metal polishing to the mask, removing the mask, forming a top spacer by conformal deposition and directional etch back to form a recessed area, growing a top source-drain epitaxial layer of a second type on the first fin and the top spacer, forming a first contact on the top source-drain epitaxial layer, and forming a second contact on the bottom source-drain layer.

The bottom source-drain layer and the top source-drain epitaxial layer are highly doped of the second type compared to the doping of the substrate of the first type. The mask includes a SiNx material hard mask, the top spacer can be a SiNx material or any other low-k dielectric such as SiCON, SiBCN and etc., and the first type is either one of a p-type or an n-type and the second type is the other one of the p-type or the n-type.

The method can also include forming a plurality of fins including the first fin and a second fin from the channel layer with masks on top of the first fin and the second fin. The width of each of the masks is wider than the final width of the first fin and the second fin. The trimming can further include laterally trimming the first fin under the mask.

In another example aspect of present invention, there is described a vertical FET (Field-Effect Transistor), a substrate of a first type, a bottom source-drain layer of a highly doped second type, a channel layer formed on the bottom source-drain layer, a first fin formed from the channel layer disposed on the bottom source-drain layer, and a gate layer formed around the first fin. The location of a gate top edge of the gate layer is defined by a mask that is removed.

In yet another example aspect of present invention, there is described a method of forming a vertical FET (Field-Effect Transistor), including growing a bottom source-drain layer of a second type on a substrate of a first type, growing a channel layer on the bottom source-drain layer, forming a plurality of fins from the channel layer, the mask is formed on top of each of the plurality of fins, a width of the mask is wider than a final width of the fins, trimming the first fin laterally to a predetermined width, forming a bottom spacer on the bottom source-drain layer, forming a high-k dielectric layer on the bottom spacer, first fin, and the mask, and forming metal gate layer on the high-k dielectric layer. A location of a gate top edge of the gate layer is defined by the mask that is removed.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

It is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF DRAWINGS

The exemplary aspects of the invention will be better understood from the following detailed description of the exemplary embodiments of the invention with reference to the drawings.

DETAILED DESCRIPTION OF A PREFERRED EMBODIMENTS

Figure 1:
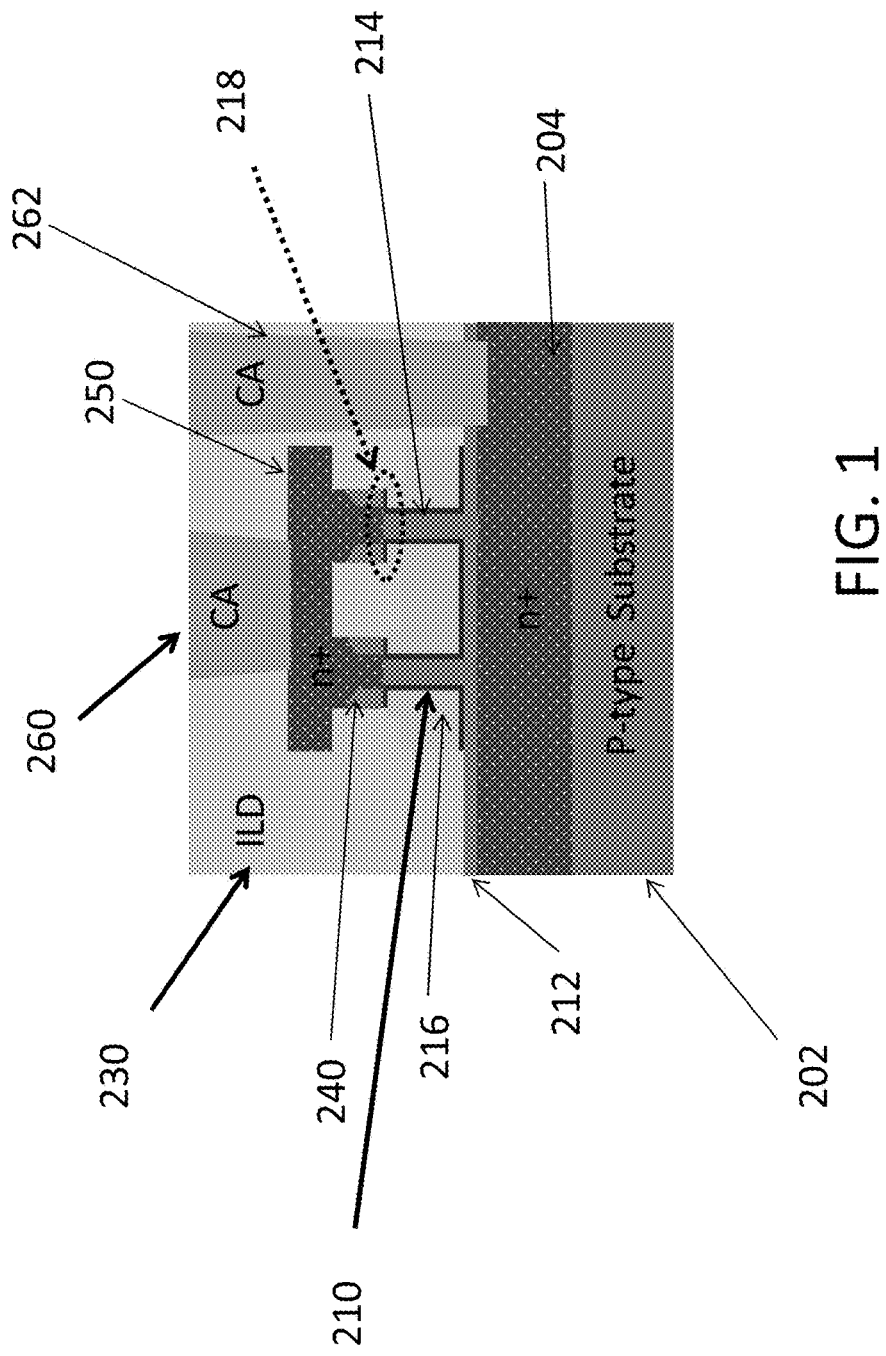
FIG. 1 illustrates a final VFET structure in an example embodiment.

The invention will now be described with reference to the drawing figures, in which like reference numerals refer to like parts throughout. It is emphasized that, according to common practice, the various features of the drawing are not necessary to scale. On the contrary, the dimensions of the various features can be arbitrarily expanded or reduced for clarity. Exemplary embodiments are provided below for illustration purposes and do not limit the claims.

Gate length control is very important in vertical FETs. In the present invention, the location of metal gate top is defined by the hard mask used for fin formation such that it is not relevant to gate recess.

FIG. 1 illustrates a final VFET structure in an example embodiment. As shown, a p-type (or n-type) substrate 202 is used with a heavily doped n+ (or p+) bottom source-drain layer 204. The bottom space 212 is formed above the bottom source-drain layer 204. The fins 210 are formed above the bottom source-drain 204 layer. A high-k dielectric layer 214 is formed around the fins 210. A top spacer 240 is formed above the fins 210, while the top source-drain epi (epitaxial) layer 250 is formed above the fins 210. The gate material 216 is formed around the fins 210 while ILD (interlayer dielectric) is deposited on the structure. Additionally, contacts 260 connect the top source-drain epi layer 250 and the contact 262 connect the bottom source-drain 204. The location of gate 216 top edge 218 is defined by a sacrificial fin mask 208 (See FIG. 7). An example method of forming the vertical FET structure is provided in the following.

Figure 2:
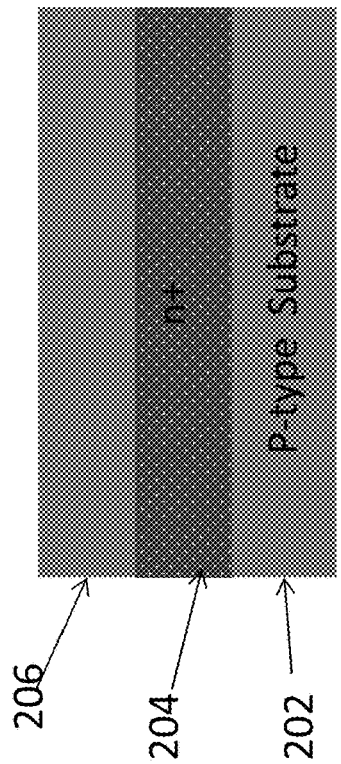
FIG. 2 illustrates a starting material.

FIG. 2 illustrates a starting material. Here an n-FET structure is used as example. Similarly with this method, a p-FET structure can be made.

The method starts with p-type substrate 202. First grow highly doped n+ type bottom source-drain layer 204 which will become the source-drain layer and then grow the low doped channel layer 206.

Figure 3:
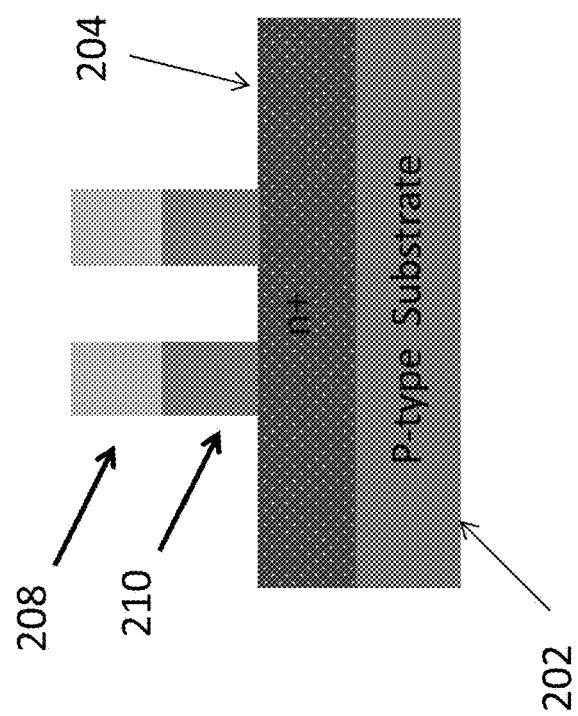
FIG. 3 illustrates a fin formation.

FIG. 3 illustrates a fin formation. The fin 210 is formed with a SiNx hard mask 210 on the top. Other methods of forming the fin can be used. The width of the hard mask 208 is intentionally made wider than the final fin width.

Figure 4:
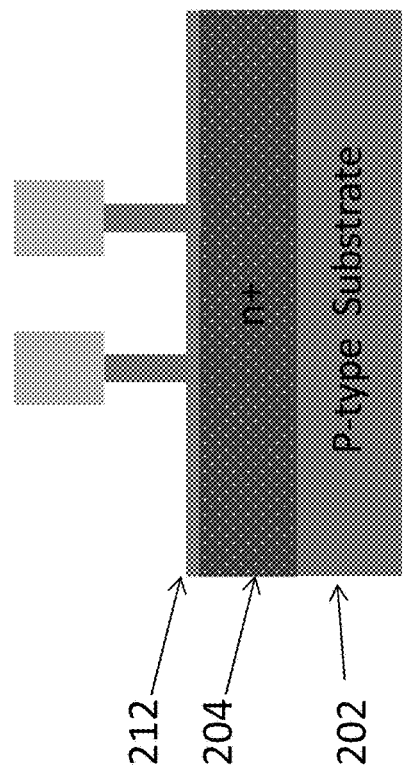
FIG. 4 illustrates trimming the fin.

FIG. 4 illustrates trimming the fin. The fin 210 can be trimmed selectively by etching. It can be performed alternatively, by oxidation and then remove the oxide or by direct etching or atomic layer etching where a repetitive fixed amount of material is removed.

Figure 5:
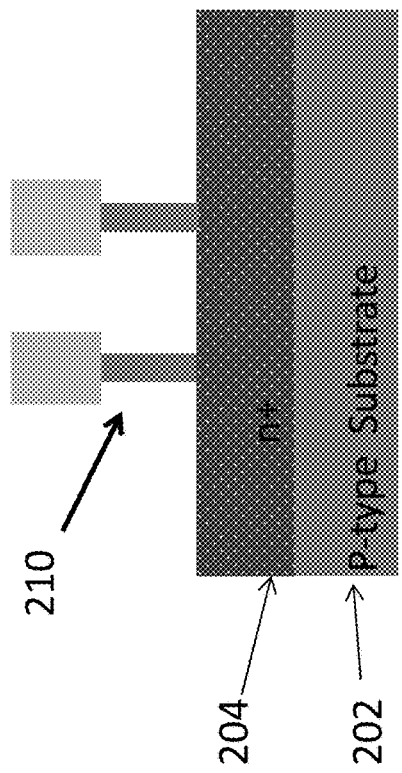
FIG. 5 illustrates forming a bottom spacer.
Figure 6:
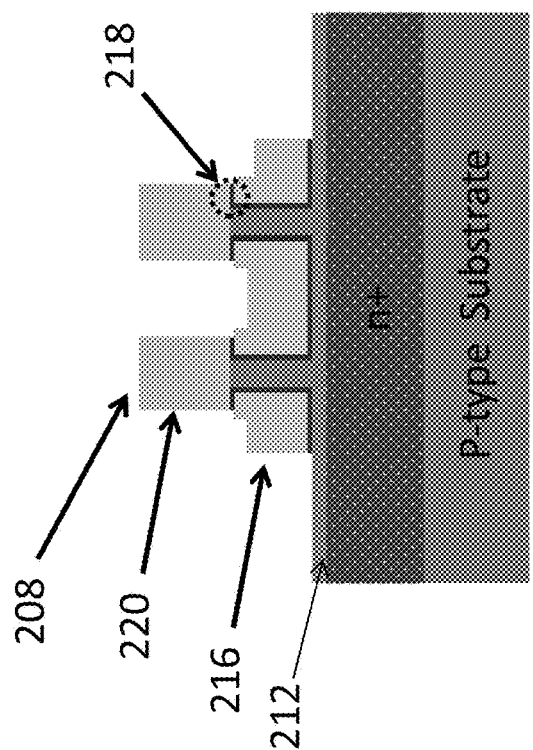
FIG. 6 illustrates forming a high-k and metal gate.

FIG. 5 illustrates bottom spacer 212 being formed on the bottom source-drain layer 204. FIG. 6 illustrates the forming a high-k and metal gate. The high-k material 214 is deposited on top of the bottom spacer 212. Then the metal gate material 216 is deposited.

Figure 7:
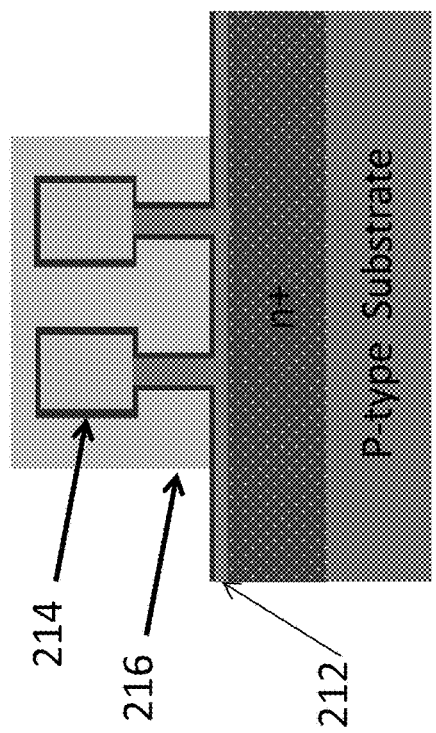
FIG. 7 illustrates a metal gate recess in the example structure.

FIG. 7 illustrates a metal gate recess in the example structure. The metal gate 216 is recessed as shown. Please note that the bottom edge of SiNx hard mask 218 limits the channel length. The exposed high-k 214 is removed around region 220.

Traditionally, if you want to the gate metal, the stop point determines the gate length. Now, in the present invention, one does not have to worry about where to stop. The wider hard mask 208 on top provides where a corner 218 that determines the position of the gate metal 216 and will not be effected by the RIE (reactive ion etching) process. The RIE process is directional and will not etch material under the hard mask 208. Therefore, the corner 218 shows that the portion is not etched during the RIE process and so that part determines the gate length. Therefore, the area 218 provides the edge of the real gate.

Figure 8:
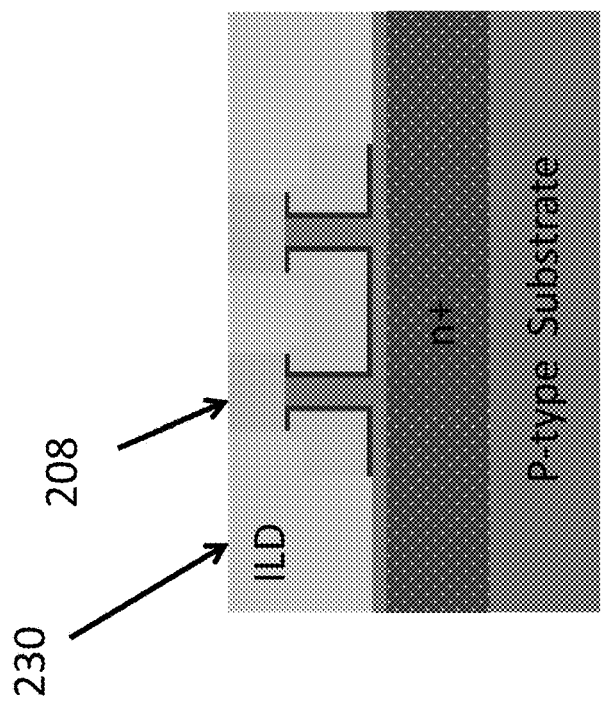
FIG. 8 illustrates performing ILD and CMP.

FIG. 8 illustrates performing ILD and CMP. As shown, the structure is filled with ILD (interlayer dielectric) oxide over the whole structure. Then CMP (Chemical Metal Polishing) structure and stop at the top of the SiNx hard mask 208.

Figure 9:
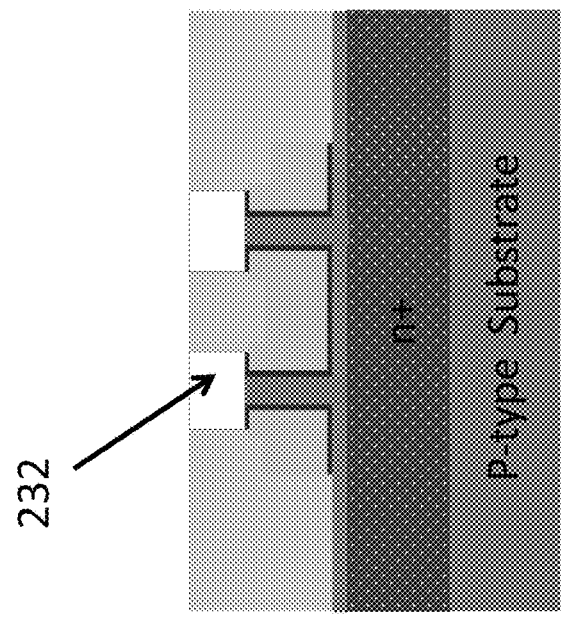
FIG. 9 illustrates a removal of a material.

FIG. 9 illustrates a removal of a material. The SiNx hard mask 208 is removed as seen in point 232.

Figure 10:
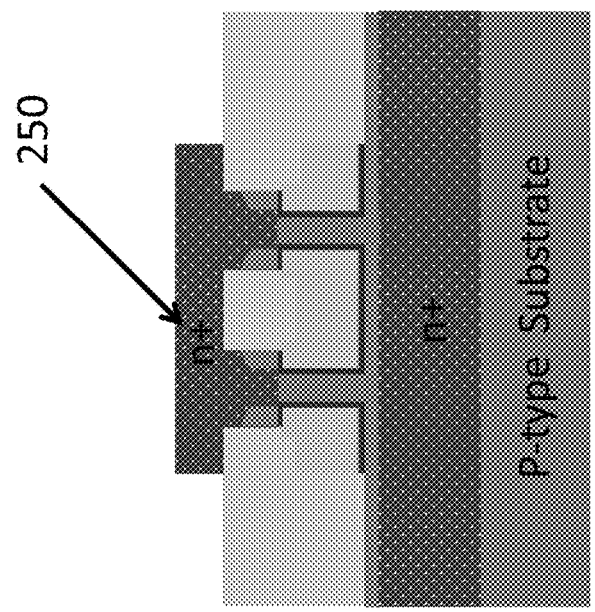
FIG. 10 illustrates forming a top spacer.

FIG. 10 illustrates forming a top spacer. Form SiNx top spacer 240 by conformal deposition and directional etch back.

Figure 11:
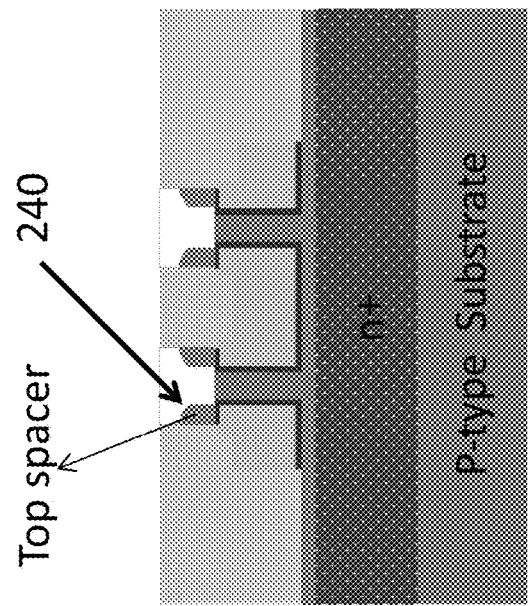
FIG. 11 illustrates growing a top source-drain epitaxial layer.

FIG. 11 illustrates growing a top source-drain epitaxial (epi) layer. Grow top source-drain epi layer 250. The epi layer 250 from the top of the two fins 210 are merged together as shown. The epi layer 250 may also not be merged at the two top fins 210.

Figure 12:
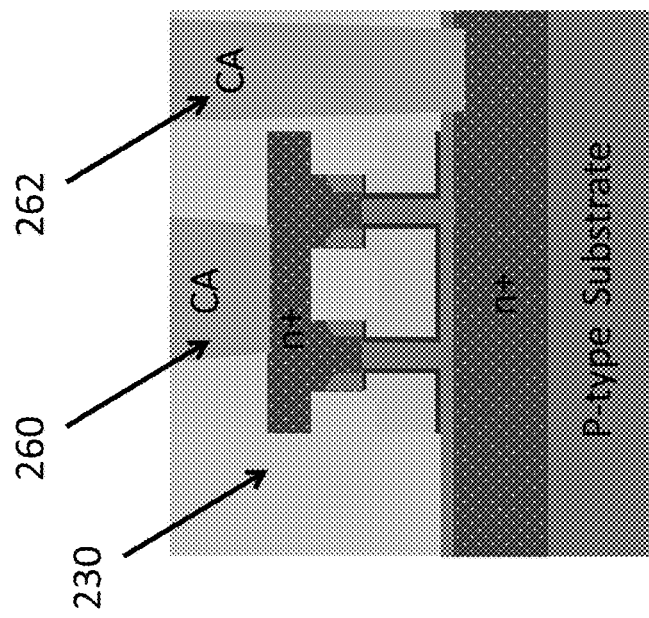
FIG. 12 illustrates a downstream process.

FIG. 12 illustrates a downstream process. Finish downstream process to form the final transistor. The contact 260 to the top source-drain epi layer 250 and the contact 262 to the bottom source-drain layer 204 is formed. Thus, the final structure of FIG. 1 is formed thereafter.

Figure 13:
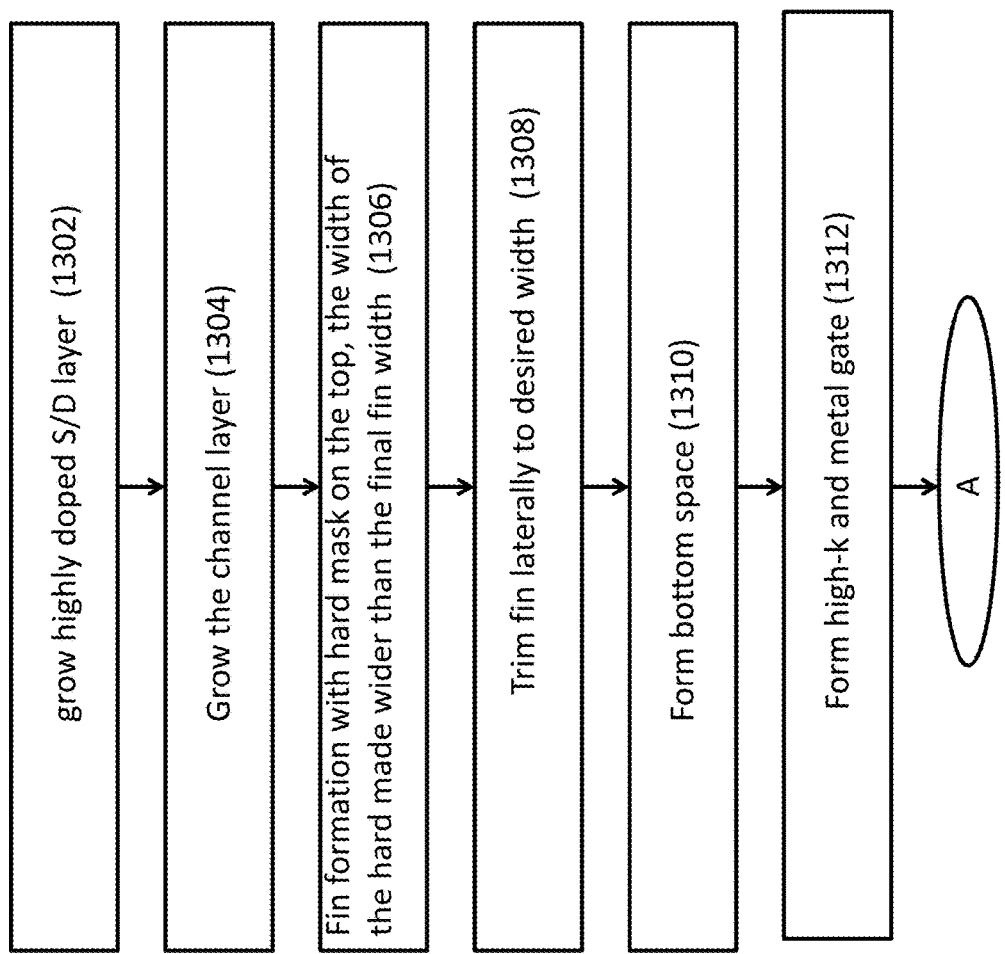
FIG. 13 illustrates a flowchart of an example embodiment.

FIG. 13 illustrates a flowchart of an example embodiment. In step 1302, grow highly doped source-drain layer on a substrate. Then in step 1304, grow the channel layer. Then in step 1306, there is fin formation with SiNx hard mask on the top, the width of the hard mask is intentionally made wider than the final fin width. Thereafter, in step 1308, trim fin laterally to desired width. Then in step 1310, form the bottom spacer. Then in step 1312 the high-k dielectric and the metal gate is formed.

Figure 14:
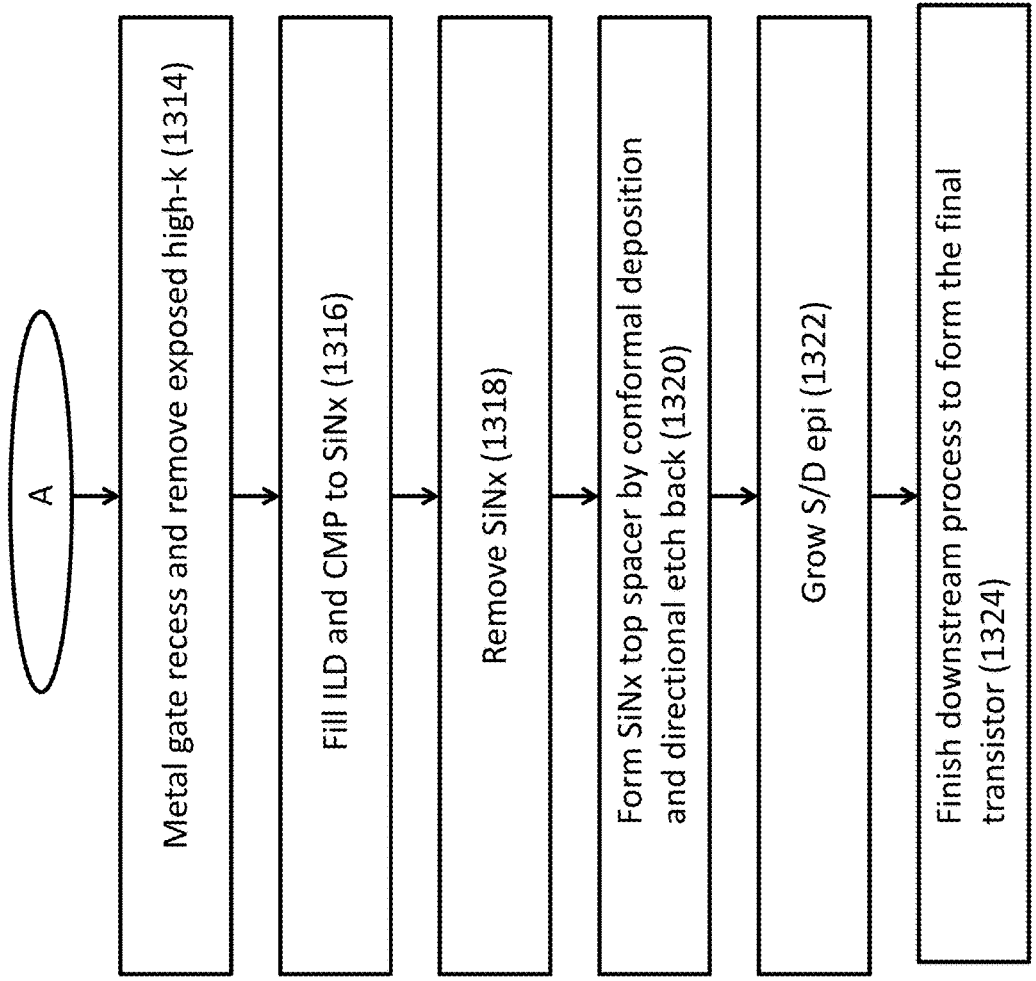
FIG. 14 illustrates a continuation of the flowchart of FIG. 13 in an example embodiment.

FIG. 14 illustrates a continuation of the flowchart of FIG. 13 in an example embodiment. Referring to FIG. 14, after step 1312, the metal gate recess is formed and exposed high-k dielectric is removed (Step 1314). Then, in step 1316, ILD is filled and CMP is performed to the SiNx mask. Then in step 1318, SiNx is removed. Then in step 1320, SiNx top spacer is formed by conformal deposition and directional etch back. Then in step 1322 the source-drain epi is formed.

Then, finally in step 1324, downstream process is finished to form the final transistor structure as seen in FIG. 1.

The many features and advantages of the invention are apparent from the detailed specification, and thus, it is intended by the appended claims to cover all such features and advantages of the invention, which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A method of forming a vertical PET (Field-Effect Transistor), comprising:
   growing a bottom source-drain layer of a second type on a substrate of a first type;
   growing a channel layer on the bottom source-drain layer; and
   forming a first fin from the channel layer with a mask on top of the first fin,
   wherein a width of the mask is wider than a final first fin width.

2. The method according to claim 1, further comprising:
   trimming the first fin laterally to a predetermined width; and
   forming a bottom spacer on the bottom source-drain layer.

3. The method according to claim 2, further comprising:
   forming a high-k dielectric layer on the bottom spacer, first fin, and the mask; and
   forming and metal gate layer on the high-k dielectric layer.

4. The method according to claim 3, further comprising:
   recessing the metal gate layer; and
   removing an exposed portion of the high-k dielectric layer.

5. The method according to claim 4, further comprising:
   filling an interlayer dielectric over the bottom spacer;
   performing q chemical metal polishing to the mask; and
   removing the mask.

6. The method according to claim 5, further comprising:
   forming a top spacer by conformal deposition and directional etch back to form a recessed area.

7. The method according to claim 6, further comprising:
   growing a top source-drain epitaxial layer of a second type on the first fin and the top spacer.

8. The method according to claim 7, further comprising:
   forming a first contact on the top source-drain epitaxial layer; and
   forming a second contact on the bottom source-drain layer.

9. The method according claim 1, wherein the bottom source-drain layer and a top source-drain epitaxial layer are highly doped of the second type compared to the doping of the substrate of the first type.

10. The method according to claim 1, wherein the mask comprises a SiNx material hard mask,
    wherein a top spacer comprises a SiNx material, and
    wherein the first type is either one of a p-type or an n-type and the second type is the other one of the p-type or the n-type.

11. The method according to claim 1, forming a plurality of fins including the first fin and a second fin from the channel layer with masks on top of the first fin and the second fin,
    wherein a width of each of the masks is wider than the final width of the first fin and the second fin.

12. The method according to claim 2, wherein the trimming further comprising laterally trimming the first fin under the mask.

13. A vertical FET (Field-Effect Transistor), comprising:
    a substrate of a first type;
    a bottom source-drain layer of a highly doped second type;
    a channel layer formed on the bottom source-drain layer;
    a first tin formed from the channel layer disposed on the bottom source-drain layer; and
    a gate layer formed around the first tin,
    wherein a location of a gatetop edge of the gate layer is defined by a mask that is removed.

14. The vertical FET according to claim 13,
    wherein the first fin is formed with a mask on top of the first fin, and
    wherein a width of the mask is wider than a final first fin width when the mask is removed.

15. The vertical FET according to claim 13, further comprising:
    a bottom spacer formed on the bottom source-drain layer; and
    a high-k dielectric layer formed on the bottom spacer and the first fin,
    wherein the gate layer is formed on the high-k dielectric layer.

16. The method according to claim 3, further comprising:
    an interlayer dielectric filled over the bottom spacer;
    a top spacer formed by conformal deposition and directional etch back to form a recessed area, and
    a top source-drain epitaxial layer of a second type formed on the first fin and the top spacer.

17. A method of forming a vertical FET (Field-Effect Transistor), comprising:
    growing a bottom source-drain layer of a second type on a substrate of a first type;
    growing a channel layer on the bottom source-drain layer;
    forming a plurality of fins from the channel layer,
    wherein a mask is formed on top of each of the plurality of fins,
    wherein a width of the mask is wider than a final width of the fins;
    trimming the first fin laterally to a predetermined width;
    forming a bottom spacer on the bottom source-drain layer;
    forming a high-k dielectric layer on the bottom spacer, first fin, and the mask; and
    forming metal gate layer on the high-k dielectric layer,
    wherein a location of a gate top edge of the gate layer is defined by the mask that is removed.

18. The method according to claim 17, further comprising:
    recessing the metal gate layer; and
    removing an exposed portion of the high-k dielectric layer.

19. The method according to claim 18, further comprising:
    filling an interlayer dielectric over the bottom spacer;
    performing chemical metal polishing to the masks; and
    removing the masks.

20. The method according to claim 19, further comprising:
    forming a top spacer by conformal deposition and directional etch back to form a recessed area; and
    growing a top source-drain epitaxial layer of a second type on the plurality of fins and the top spacer.

* * * * *